United States Patent [19]

Jillie et al.

[11] Patent Number: 4,554,567
[45] Date of Patent: * Nov. 19, 1985

[54] SUPERCONDUCTIVE INTEGRATED CIRCUIT INCORPORATING A MAGNETICALLY CONTROLLED INTERFEROMETER

[75] Inventors: Don W. Jillie, Arlington; Lawrence N. Smith, Lexington, both of Mass.

[73] Assignee: Sperry Corporation, New York, N.Y.

[*] Notice: The portion of the term of this patent subsequent to Feb. 7, 2001 has been disclaimed.

[21] Appl. No.: 477,278

[22] Filed: Mar. 21, 1983

[51] Int. Cl.$^4$ .............................................. H01L 39/22
[52] U.S. Cl. .......................................... 357/5; 357/27; 357/55; 357/51
[58] Field of Search .......................... 357/5, 27, 55, 51

[56] References Cited

U.S. PATENT DOCUMENTS

| | | | |
|---|---|---|---|
| 4,177,476 | 12/1979 | Kroger et al. | 357/5 |
| 4,421,785 | 12/1983 | Kroger | 357/5 X |
| 4,423,430 | 12/1983 | Hasuo et al. | 357/5 |
| 4,430,662 | 2/1984 | Jillie, Jr. et al. | 357/5 |

Primary Examiner—Andrew J. James
Assistant Examiner—William A. Mintel
Attorney, Agent, or Firm—Howard P. Terry; Arnold L. Albin

[57] ABSTRACT

Superconductive integrated logic gate circuits of the magnetically controlled type incorporating Josephson tunnel junctions utilize a superconductive layer that forms a base electrode for Josephson junction devices on the integrated circuit, a ground plane, and magnetic control lines. A layer of super-conductive material superposed on a barrier layer provides inductive loops connected to junction counterelectrodes and coupled to the magnetic control lines. By patterning the control lines in the same plane as the ground plane-base electrode layer, two layers, an insulating layer and a superconductive layer, can be eliminated from the prior art structure of a 1:2:1 magnetically controlled logic gate interferometer. A preferred embodiment utilizing an all refractory superconductor-barrier-superconductor trilayer patterned by local anodization is also described. Processes for manufacturing the embodiments of the invention are disclosed.

20 Claims, 11 Drawing Figures

SUPERCONDUCTIVE INTEGRATED CIRCUIT INCORPORATING A MAGNETICALLY CONTROLLED INTERFEROMETER

BACKGROUND OF THE INVENTION

1. Field of the Invention

The invention relates generally to superconductive integrated circuits, and more particularly with respect to Josephson junction integrated circuits of the magnetically controlled interferometer type.

2. Description of the Prior Art

A Josephson junction comprises two superconductive layers with a thin barrier layer interposed therebetween, which, when in a superconductive state, may permit superconductive electron pairs to tunnel therethrough. It is a peculiar characteristic of the Josephson junction that it can exist in two distinct states, the zero voltage state and the nonzero voltage state. The nonzero voltage state is attained by exceeding the current carrying capability of the zero voltage state, the required current being called the critical current of the junction and the critical current being a property of the junction. A further property of the critical current is that it may be modulated by the application of a magnetic field parallel to the plane of the thin barrier layer.

The Josephson junction has been employed as a logic gate, using either a control current exceeding the critical current, or a predetermined magnetic field, usually applied by means of passing a current thru a nearby conductor to effect the switch from zero to nonzero voltage. In the practice of the art of Josephson circuit fabrication, the single junction has been replaced by logic gates consisting of two or more junctions, along with conventional circuit elements, such as resistors, inductors and capacitors. The reason for this involve fundamental issues such as current gain, isolation and scaling behavior, and are well known in the art. Josephson logic gates further subdivide into two basic types. Current injection gates are switched by the application of control current directly into the gate, in analogy with current switching in a single junction. Josephson current injection logic gates are of relatively simple construction, but since the control current is applied in common with a bias current to the gate, isolation between the input and output components is not complete.

A second type of Josephson logic gate is the magnetically controlled gate, commonly known as an interferometer or squid (for superconducting quantum interference device), the former term being preferred by those practicing the art of Josephson integrated circuit fabrication. In the interferometer, two (or more) junctions are placed in parallel with the bias current and in series with a loop inductor therebetween. A control inductor is coupled by a mutual inductance to the loop inductor. Passage of control current thru the control inductor, or control line, causes an induced current to flow in the loop containing the two junctions and the loop inductor. This current adds to the bias current in one junction in the loop and substracts from the bias current of the other junction. If the additive currents exceed the critical current of that junction, it switches to the nonzero voltage state, thereby shunting the full bias current to the otherjunction and interrupting the flow of loop current. For properly chosen parameter values, the second junction also switches to the nonzero voltage state, thereby completing the switching of the interferometer as a whole, and shunting the bias current into an output transmission line for further use in controlling subsequent logic gates. Note that control of an interferometer is by means of magnetically coupling to the loop inductor, whereas magnetic control of a single junction is effected by coupling to the barrier layer of the junction itself. The magnetically controlled logic gate permits isolating the bias current from the signal current but has the disadvantage of requiring a larger number of structural layers and therefore, a larger number of manufacturing steps. In addition, since many of the required patterns are made by evaporation or sputtering of thin films defined by etching or photoresist lift-off, the large number of manufacturing operations often results in a low device yield.

In U.S. Pat. No. 4,430,662, issued Feb. 7, 1984 and assigned to the assignee of the present invention, filed Apr. 9, 1981, by Don W. Jillie, Jr. and Lawrence N. Smith, assigned to the Assignee of the present application, a technique was described for combining the functions of the Josephson lower electrode and ground plane into one superconductive layer, thereby eliminating one superconductive layer and one insulator layer from the then state of the art fabrication process as applied to current injection logic gates. It is an object of the present invention to show how to construct Josphson magnetically controlled logic gate interferometers using the fabrication sequence developed for current injection logic gates, thereby eliminating two layers from the otherwise more complex structure. Beneficially, the process sequence and component layout described in the present invention requires only five layers and only five photo-resist patterning steps plus a barrier and an anodization step for the Selective Niobium Anodization Process (SNAP), which is fewer than other means of fabricating these gates. The SNAP, as described in U.S. Pat. No. 4,421,785 issued Dec. 20, 1983, in the name of Harry Kroger, and assigned to the Assignee of the present invention, requires at least seven depositing and patterning steps to fabricate a conventional interferometer. A magnetically controlled logic gate constructed by conventional prior art procedures, such as with lead alloy superconductive layers, requires as many as 12 layers and 12 patterning steps, plus a junction barrier formation step.

SUMMARY OF THE INVENTION

A magnetically controlled logic gate constructed according to the principles of the present invention is fabricated with a first layer of superconductive material forming a ground plane/base electrode for the integrated logic circuit, a second layer of superconductive material superposed with respect to the first layer, and a Josephson tunneling barrier between the first and second layers, limited regions of the first and second layers forming Josephson junction electrodes with respect to the barrier. The first layer is patterned to provide magnetic control lines and also defines the base electrode. The second layer forms counter electrodes. A third layer of superconductive material, superposed on the second layer and insulated therefrom, provides inductive loops superposed with respect to the magnetic control lines and also makes contact with the counter-electrodes. Superconducting current through the inductive loops is interrupted by applying a control current to the superconducting control lines in the same manner as with logic gates fabricated by the prior art. By patterning the control lines in the same plane as the ground plane-base electrode, two layers—an insulating layer and a superconductive layer—can be eliminated from the structure as practiced heretofore.

In one embodiment of the invention, a 1:2:1 magnetically controlled Josephson logic gate interferometer is implemented with five layers of superconductive material and insulating material, with an additional barrier layer and an anodizing step for use in the SNAP all-refractory fabrication procedure. As few as four layers and patterning steps are required for fabrication procedures with non-refractory alloys which do not embody the SNAP process; however, an additional insulation layer and patterning step is required for circuitry more complex than the simple 1:2:1 interferometer device. Flux traps are provided for additional shielding. Co-planar linear transmission lines used in place of parallel plate lines of the prior art provide high inductance with short loop length. Other features of the invention will become apparent from the following description and from the accompanying drawings which illustrate preferred embodiments thereof.

DESCRIPTION OF THE PREFERRED EMBODIMENTS

Figure 1:
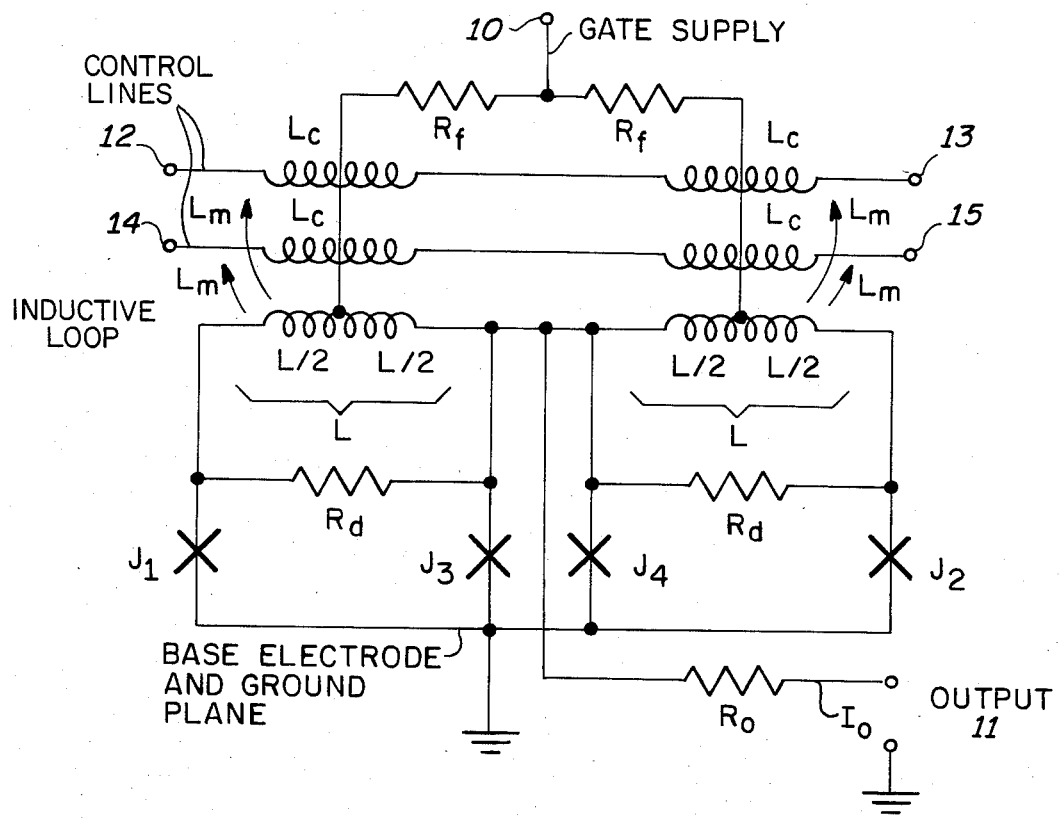
FIG. 1 is a schematic diagram showing an equivalent circuit of a three junction 1:2:1 Josephson interferometer type of magnetically controlled logic gate.

The magnetically controlled Josephson interferometer relies on gating the circuit in response to currents induced from a control line coupled to superconductive inductive loops connected to the Josephson junctions. While heretofore the prior art construction generally relied on control lines superposed over both the inductive loops and the Josephson junctions, which required additional conductive and insulating layers, the present invention beneficially couples the control lines only to the interferometer inductive loops, such that no additional conductive and insulating layers are required. This construction relies on the recognition that magnetic coupling to the junctions themselves is not required, and indeed may be undesirable for an interferometer circuit.

The interferometer inductive loops are here formed as an extension of the upper junction electrodes, also referred to herein as counter electrodes, and the control lines can be formed from the same layer as that of the opposing junction lower electrodes also referred to herein as base electrodes. This technique is shown to be fully compatible with the prior disclosure of Jillie and Smith in said U.S. Pat. No. 4,430,662, which demonstrated that the functions of the ground plane and base electrode could be satisfied with a single layer of superconductive material.

Josephson microcircuits are typically constructed utilizing one or both of superconductors such as niobium and lead alloys. The techniques of the present invention described herein are applicable to both materials, the basic concepts of the invention being applicable to more general circuits than the particular embodiments described. While applications to conventional fabrication techniques are discussed, the invention is preferably utilized in conjunction with refractory materials such as niobium junctions formed utilizing the local anodization technique of said U.S. Pat. No. 4,421,785.

Prior art integrated circuits for interferometers require at least nine layers and patterning steps. Fabrication involves the deposition of five metal layers, four insulator layers, and a junction barrier formation step. Four superconductors form the ground plane, lower Josephson electrode, upper Josephson electrode, and control lines. The fifth metal layer is used to form resistors. Insulator layers are used to separate each superconductor layer from the adjacent layer. An improved structure using the suggestions of Jillie and Smith as in said U.S. Pat. No. 4,430,662 for construction of a 1:2:1 interferometer with non-refractory superconductive alloy layers is shown in Table I below:

TABLE I

| Layer | Material | Function |
|---|---|---|
| | Prior Art Interferometer | |
| $S_1$ | Superconductor (2500 A) | Form groundplane, Josephson junction base electrode, and flux traps |
| $I_1$ | Insulator (2500 A) | Groundplane insulation and Josephson junction openings |
| $R_1$ | Resistor (800 A) | Damping, power and terminating resistors |
| B | Oxide, deposited semiconductor (30-100 A) | Form Josephson tunneling barrier |
| $S_2$ | Superconductor (3000 A) | Form Josephson junction counterelectrodes, inductive loops, transmission lines, buses |
| $I_2$ | Insulator (3500 A) | Control line insulation |
| $S_3$ | Superconductor (4000 A) | Control lines, flux shields |

Three superconductive layers and two insulating layers, plus a barrier formation and resistor layer, each accompanied by a patterning step, are required for a total of 6 layers and 6 patterning steps, plus a barrier.

The embodiments of the present invention eliminate two deposition steps and two patterning steps with respect to the structures and processing of Table I. The present invention combines the groundplane, the Josephson base electrode, and the control lines into one layer. The present invention thus eliminates one layer of superconductor ($S_3$) and the associated insulator layer ($I_2$).

Referring to FIG. 1, in which like element designations refer to the same or similar elements, a schematic equivalent circuit for an integrated circuit configured and fabricated in accordance with the present invention for a 1:2:1 three-junction Josephson magnetically controlled interferometer logic gate is illustrated. The center junction is comprised of two identical junctions $J_3$, $J_4$ whose combined critical current is twice that of the other two junctions $J_1$, $J_2$; thus, the junction critical currents are in the ratio of 1:2:1. Input power is applied at terminal 10 to feed resistors $R_f$, the supply current dividing equally between the resistors in a symmetrically disposed circuit. Resistor $R_f$ may be replaced alternatively with an inductor, not shown. The output current $I_o$ is delivered at output terminal 11. The output transmission line has a characteristic impedance $Z_o$, and is preferably terminated by matching resistor $R_o$, as shown in FIG. 1. Note that $R_o$ may be incorporated in the gate structure or as an external element. Resistor $R_0$ is coupled to receive current from the counter electrodes of junctions $J_3$, $J_4$ and through respective inductive loops L, L to the counter electrodes of junctions $J_1$, $J_2$. A damping resistor $R_d$ is connected from each counter electrode of junctions $J_1$ and $J_2$ to the respective counter electrodes of the associated pair of commonly coupled junctions, $J_3$ and $J_4$. Connected also between the respective counter electrodes of each of the pairs of junctions, $J_1$-$J_3$ and $J_2$-$J_4$, in parallel with each resistor $R_d$, is inductor L, comprised of two sections L/2 with the common tap thereof returned to gate supply 10 through respective resistors $R_f$. Two control lines 12-13 and 14-15, comprised of two inductors $L_c$ in series connection in each line, are coupled by respective mutual inductances $L_m$ to corresponding inductors L.

At superconducting temperatures, with no bias current applied to control lines 12-13 and 14-15, the Josephson junctions, $J_1$, $J_2$, $J_3$ and $J_4$ will be in a zero-voltage state, thereby carrying all of the supply current at terminal 11 through to the base electrode/ground plane. When a predetermined critical control current is applied to control lines 12-13 or 14-15, or both, the magnetic fields induce currents which are coupled into inductors L, and the superconducting junctions revert to the finite voltage state, thereby diverting the flow of current from supply 10 to output terminal 11. Thus, it is apparent the logic device functions as an OR gate. The logic gate shown may be combined with other logic devices such as current injection gates, or used in multiple gate array. The layers and steps utilized in fabricating a simplified Josephson junction integrated circuit using the present invention as described above are summarized in Table II, and shown in a corresponding sectional view in FIG. 2.

TABLE II

| Layer | Material | Function |
|---|---|---|
| | Improved Four Layer Interferometer | |
| $S_1$ | Superconductor (2500 A) | Form groundplane, Josephson junction, control lines, base electrodes, contact pads and flux traps |
| $I_1$ | Insulator (2500 A) | Groundplane insulation and Josephson junction and control line openings |
| $R_1$ | Resistor (800 A) | Damping, power and terminating resistors |
| B | Oxide, deposited semiconductor (30-100 A) | Form Josephson tunneling barrier |
| $S_2$ | Superconductor (3000 A) | Form Josephson junction counterelectrodes, inductive loops, transmission lines, buses, flux shields |

Figure 2:
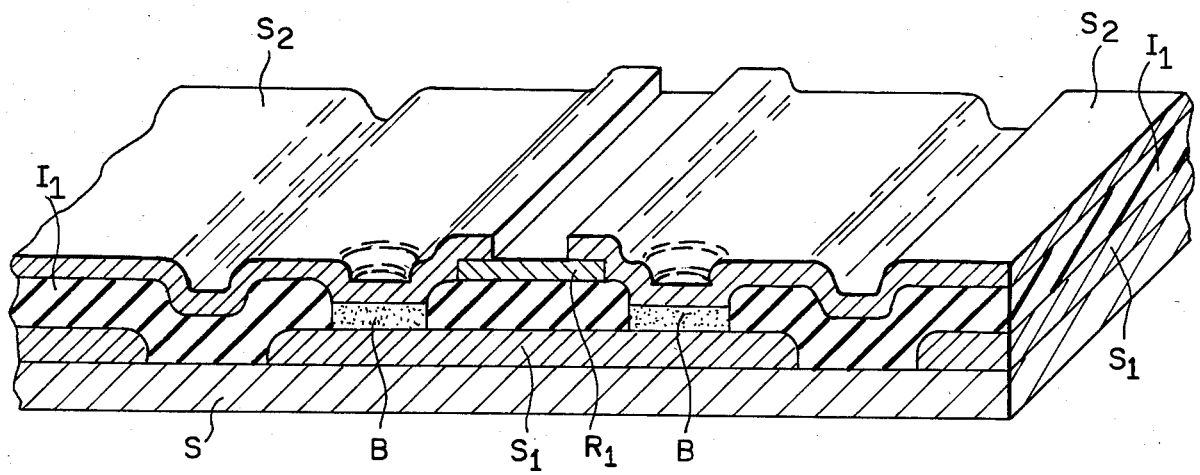
FIG. 2 is a fragmentary perspective view of a Josephson junction logic circuit showing the improved four-layer structure of the present invention.

The fabrication process described with respect to FIG. 2 and Table II utilizes four deposition steps and four patterning steps in addition to barrier formation. An anodization step with respect to the $S_1$ layer may also be included when niobium is selected for the superconductive layers.

Each of the layers and vias for Josephson junction and contact definition are formed utilizing processes known in the art. Each of the deposition steps is preceded by a patterning step when using photoresistive lift-off or followed by a patterning step when using subtractive etching, depending upon the system of materials utilized. The letters of the elements of FIG. 2 designating the layers correspond to those delineated in Table II. The letter S denotes the substrate, generally oxidized silicon. In lift-off processing an undercut photoresist mask is fabricated utilizing any one of numerous photolithographic techniques. The desired material is deposited through the mask, and the mask with the overlying material is then lifted off utilizing a suitable solvent which may be a wet or dry process. Alternatively, the fabrication may utilize subtractive etching provided that a suitable unetchable surface is included beneath the layer to be etched. Patterning may also be achieved by other means such as electron-beam lithography. Other materials, such as lead alloy, hydrogenated silicon, germanium oxide and silicon oxide, and copper gernamium alloy may be used for the respective superconductive elements, tunneling barrier, insulators, and resistors.

Referring again to FIG. 2, the superconductive layer $S_1$ is deposited onto a substrate S which typically comprises an oxidized silicon wafer. The layer $S_1$ forms the groundplane for the circuit and is patterned to define the Josephson junction base electrodes for the junctions of the interferometer, flux traps and the control lines. The superconductive layer $S_1$, if niobium, may or may not be anodized, where the purpose of anodization is to form a thin (approximately 350 Angstrom units) layer of high quality, pinhole free, insulation. The anodization is also useful for forming the dielectric for impedance matching capacitors, a circuit refinement useful in realizing the fastest switching times and reliable performance.

The second step is the deposition of an insulator layer $I_1$ which is patterned to form openings defining the Josephson junctions as well as large area openings defining large area Josephson junctions wherever electrical contacts to the groundplane are required. The insulation step may be effected utilizing insulator deposition and subtractive etching or by forming a photoresist mask for lift-off followed by the insulator deposition and lift-off by dissolving the photoresist. For example, deposition and subtractive etching may be effected by sputter-depositing silicon dioxide following by etching with buffered hydrofluoric acid. The photoresist liftoff masking technique may be implemented by utilizing evaporated silicon oxide for the insulating layer $I_1$. If the $S_1$ layer has been anodized, the anodization must be removed in the vias. For example, if $S_1$ is anodized niobium, the $Nb_2O_5$ must be etched away to form the vias or, alternatively, the anodization blocked therein by a photoresist pattern. Vias are formed in the insulating layer for the Josephson junction openings and for effecting contacts to superconductive layer $S_1$ by means of large area Josephson junctions.

The third step of the process comprises forming film resistors, including damping resistors, transmission line terminating resistors and feed resistors. The resistors may be fabricated by deposition through a lift-off photo mask typically utilizing evaporated indium-gold alloy for the resistive film or by deposition followed by subtractive etching through a photo mask which, for example, may employ deposited molybdenum etched in carbon tetrafluoride 8% oxygen plasma.

The fourth step of the process is the formation of the Josephson tunneling barriers. The barriers may comprise a native oxide or may be deposited barriers such as amorphous hydrogenated silicon. The barriers are denoted as B and are defined by openings in the insulator layer $I_1$. Barrier formation is followed by the deposition of a superconductive layer $S_2$ forming the Josephson junction counter electrodes. The formation of the $S_2$ layer may be effected by any of a variety of known techniques such as those discussed above. The $S_2$ layer is patterned to form the flux shields and the inductive loops of the interferometer as well as any required transmission line interconnections. The $S_2$ layer also forms the large area Josephson junction contacts to the groundplane layer $S_1$.

The method of contacting the groundplane through a large area Josephson junction adds some inductance to the groundplane contact. The amount of inductance added to the circuit by the large area Josephson junction is typically smaller than the stray inductances prevalent in conventional Josephson interferometers and should not present a serious problem for circuit operation. Also, compensating capacitors can be added to the control lines. The technique of utilizing the large area Josephson junction contact, however, results in the disadvantage that the contacts to the groundplane are approximately ten times larger in area than the Josephson junctions of the interferometer in order to achieve the desired critical current margins. This is, however, a small area requirement relative to the size of the entire interferometer.

Figure 3:
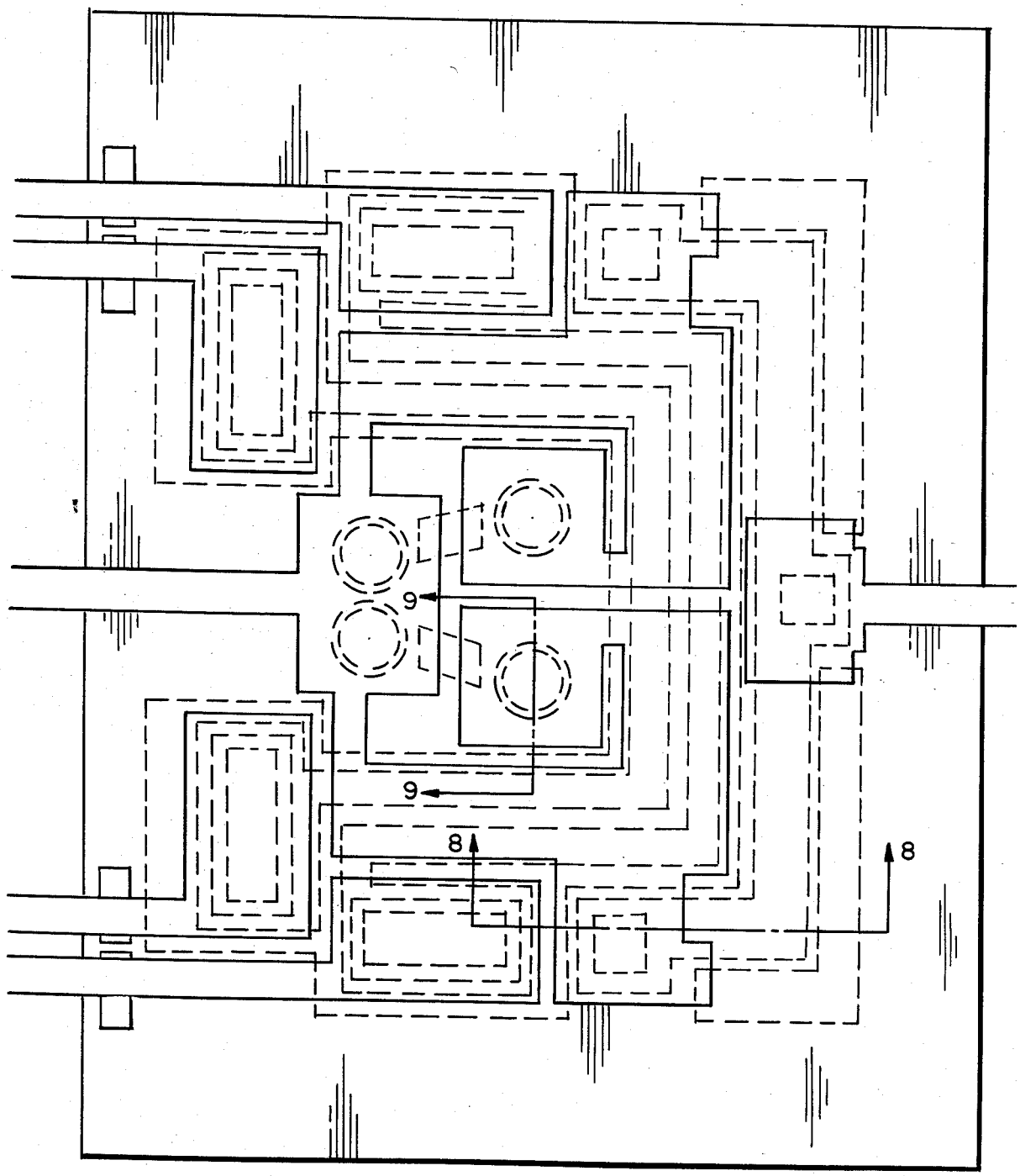
FIG. 3 is a plan view showing a composite overlay pattern embodying the schematic diagram of FIG. 1 in the present invention.

Referring now to FIG. 3, an integrated circuit chip layout is illustrated containing a 1:2:1 magnetically controlled Josephson interferometer gate fabricated in accordance with the invention. For this embodiment, the local anodization technique of said U.S. Pat. No. 4,421,785 will be employed to define the junction areas. While the prior art 1:2:1 interferometer required seven layers and seven patterning steps, plus an anodization step and a barrier formation, as noted in TABLE 5 of said U.S. Pat. No. 4,430,662, the present invention achieves the same result with only five layers and five patterning steps, plus an anodization step and barrier formation. Since it is known in the art of semiconductor integrated circuit fabrication that reducing the number of layers and process steps improves the yield of functional circuits, the present invention is believed to afford a substantial improvement in productivity over the prior art. The layers and steps utilized in fabricating the logic chip of FIG. 3 are summarized as follows in Table III and shown in plan view of FIGS. 4-7.

TABLE III

SNAP FIVE-LAYER INTERFEROMETER

| Step | Material | Purpose |
|---|---|---|
| $S_1$ | Niobium (3000 A) | Deposited sequentially with no intervening patterning steps, this sandwich is denoted as the Trilayer |
| B | Oxide, deposited semicond. (30-100 A) | |
| $S_2$ | Niobium (200-600 A) | |
| A | Anodized niobium (600-1800 A) | Josephson junctions are delineated by local anodization, layer $S_1$-B-$S_2$/A is then patterned as a whole forming groundplane, control lines, junctions, and flux traps |
| $R_1$ | Molybdenum (800 A) | Damping, feed, and terminating resistors |
| $I_1$ | $SiO_2$ (2500 A) | Groundplane, resistor & control line insulator. Vias to resistors, Josephson junctions and control lines |
| $S_3$ | Niobium (3000 A) | Transmission lines, inductive loops, interconnects, contacts to resistors and Josephson junctions |

The $S_1$-B-$S_2$ Trilayer is deposited sequentially with no intervening patterning steps on a substrate S which may typically include a base or external layer of crystalline silicon with an oxidized surface. First, a film $S_1$ of niobium approximately 3,000 angstrom units thick is deposited, followed by forming the barrier B. The barrier may be formed typically by plasma or thermal oxidation of the base material or by deposition of a very thin layer of semi conductor or insulator material. The upper layer of the Tri-layer structure is formed by depositing a relatively thin layer $S_2$ of niobium approximately 200-600 Angstrom units thick. This structure is thus a substrate essentially covered with a continuous Josephson junction. The three layers may beneficially be completed in situ without removing the substrate from the vacuum chamber. By forming the junctions on a clean unpatterned, undamaged and uncontaminated barrier surface, this procedure provides barriers with superior and consistent properties relative to junctions formed with the more conventional procedures of the prior art. Further, when barriers are deposited utilizing chemical vapor deposition, it is crucial to deposit the barrier on an unpatterned surface.

Figure 8:
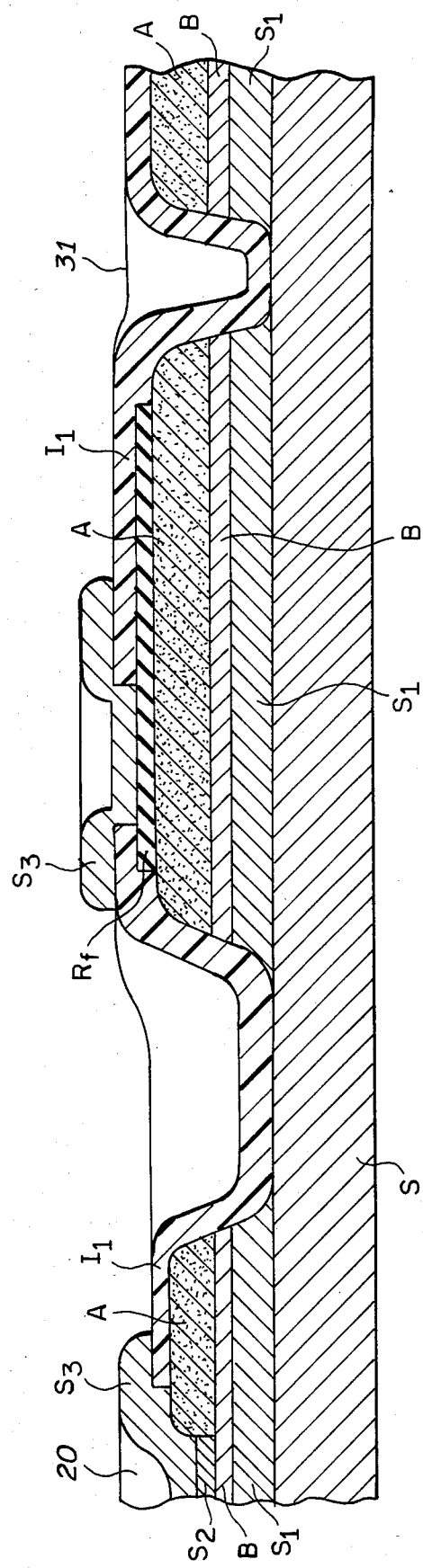
FIG. 8 is an elevation view through line 8—8 of FIG. 3, showing the five-layer structure of the integrated circuit in cross-section through a contract pad and flux trap.
Figure 9:
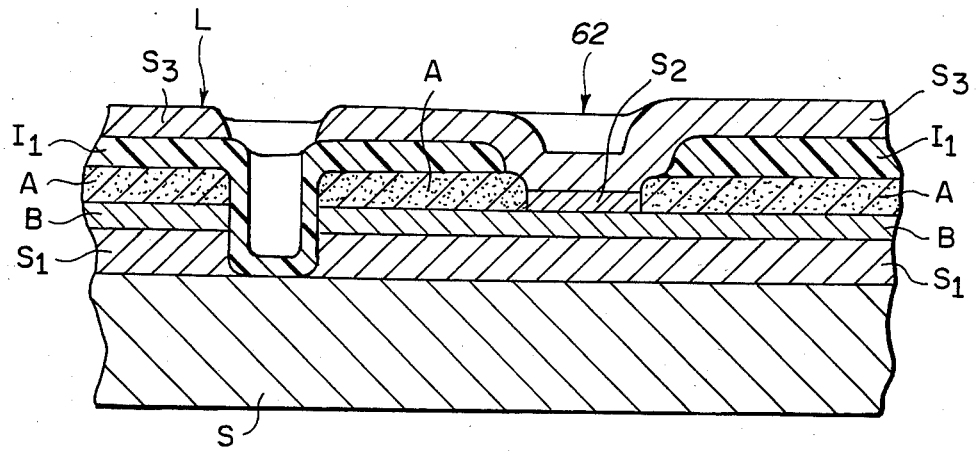
FIG. 9 is an elevation view taken along line 9—9 of FIG. 3, showing the structure of the junction electrodes in cross-section.

The first step after formation of the Trilayer comprises forming a pattern in photoresist or silicon dioxide over the desired junction contact areas and then anodizing completely through the $S_2$ layer in areas not covered by the protective coating. Large area ground plane contact junctions are provided as well as smaller areas for the Josephson interferometer junctions. As shown in FIGS. 8 and 9, which represent cross-sectional views taken along lines 8—8 and 9—9, respectively, of FIG. 3, in this one step the large and small area junctions are defined and a layer of high quality pin-hole-free insulation A is formed over the $S_1$ layer. Note that the $S_1$ layer will form the ground plane for the circuit of FIG. 1 as well as the base electrode for large area Josephson contact junctions and the base electrode for the interferometer junctions.

Figure 4:
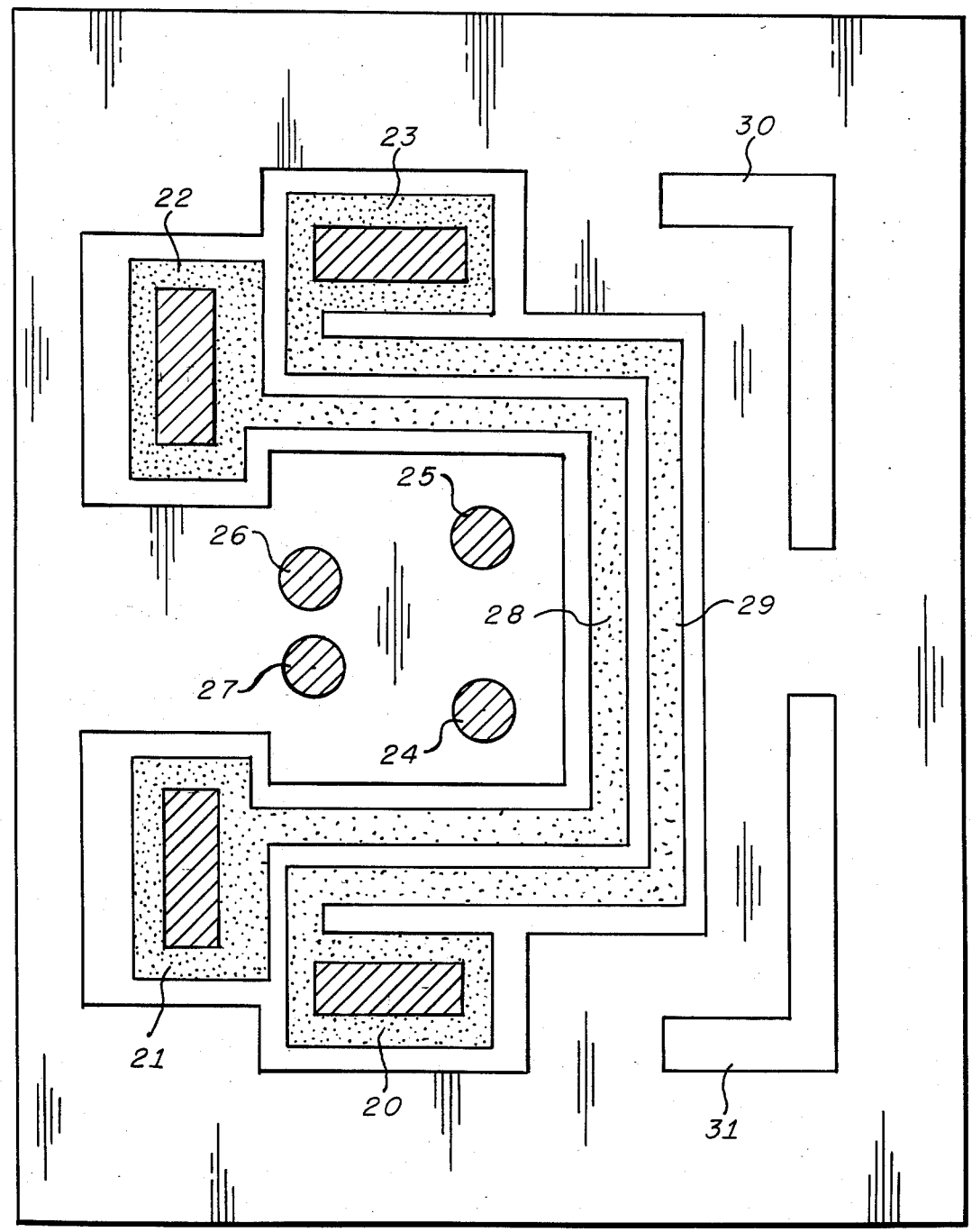
FIG. 4 is a detail of the embodiment of FIG. 3 in plan view following deposition, anodization, and patterning of the tri-layer structure.

Referring now to FIG. 4, during step 1 photoresist is applied within large area contact junctions 20-23 and Josephson junctions 24-27. After anodization, the areas within the defined junctions have Trilayer junction structures and over the remainder of the substrate the $S_2$ niobium layer has been completely anodized to niobium oxide. Following anodization, the multilayer $S_1$-B-$S_2$/A composite is patterned by masking and etching to remove selected areas of the multilayer so as to define the control lines 28 and 29 and the flux traps 30 and 31. Similarly, the areas surrounding the contact junction pads are also removed. The flux traps and control line boundaries are etched through to the substrate, while the junctions and surrounding ground plane remain as a Trilayer area.

Note that the Josephson device junctions are round to provide geometrical uniformity and the junction with the requirement for double critical current is formed from two small area junctions 26, 27 located in close proximity. Electrical contact to the control lines 28, 29 is maintained through the large area contact junctions 20-23. Alternatively, contacts could be provided through vias etched in the anodized niobium oxide layer by means of a reactive ion etch process which is capable of etching through the anodized layer and hence would not require any increase in the number of processing steps and would provide a large saving in the areas now occupied by the contact junctions. Conventional additional processing steps could also be used to etch vias through the anodized Trilayer to make a superconductive contact to the lower electrode ground plane.

The stippled shading of FIG. 4 shows the areas that remain after patterning the trilayer and removal of the undesired trilayer substance. The hatched region represents the junction areas. The majority of the region surrounding the device functions solely as a superconductive ground plane. Note that the two control lines 28 and 29 and their associated contact areas 20-23 are isolated from the surrounding regions. Two L-shaped slotted areas 30 and 31 are provided expressly for the purpose of affording preferential flux trapping sites. Since, in the superconducting state, the superconductive material will reject the magnetic field, the slots will serve as flux traps to preferentially engage the rejected magnetic field, thus capturing and rendering inoperative any undesired magnetic flux that may otherwise thread the superconducting loops in the interferometer. Such spurious flux may otherwise result in faulty threshold curves and improper operation. In the fabrication process of Table I, a solid ground-plane layer underlying the entire interferometer provides shielding from external flux. Since in this design and the process of Table II the ground-plane layer is patterned to form the control lines and is removed in the vicinity of the gate elements, such protective measures must be provided for trapping the undesired flux.

Figure 5:
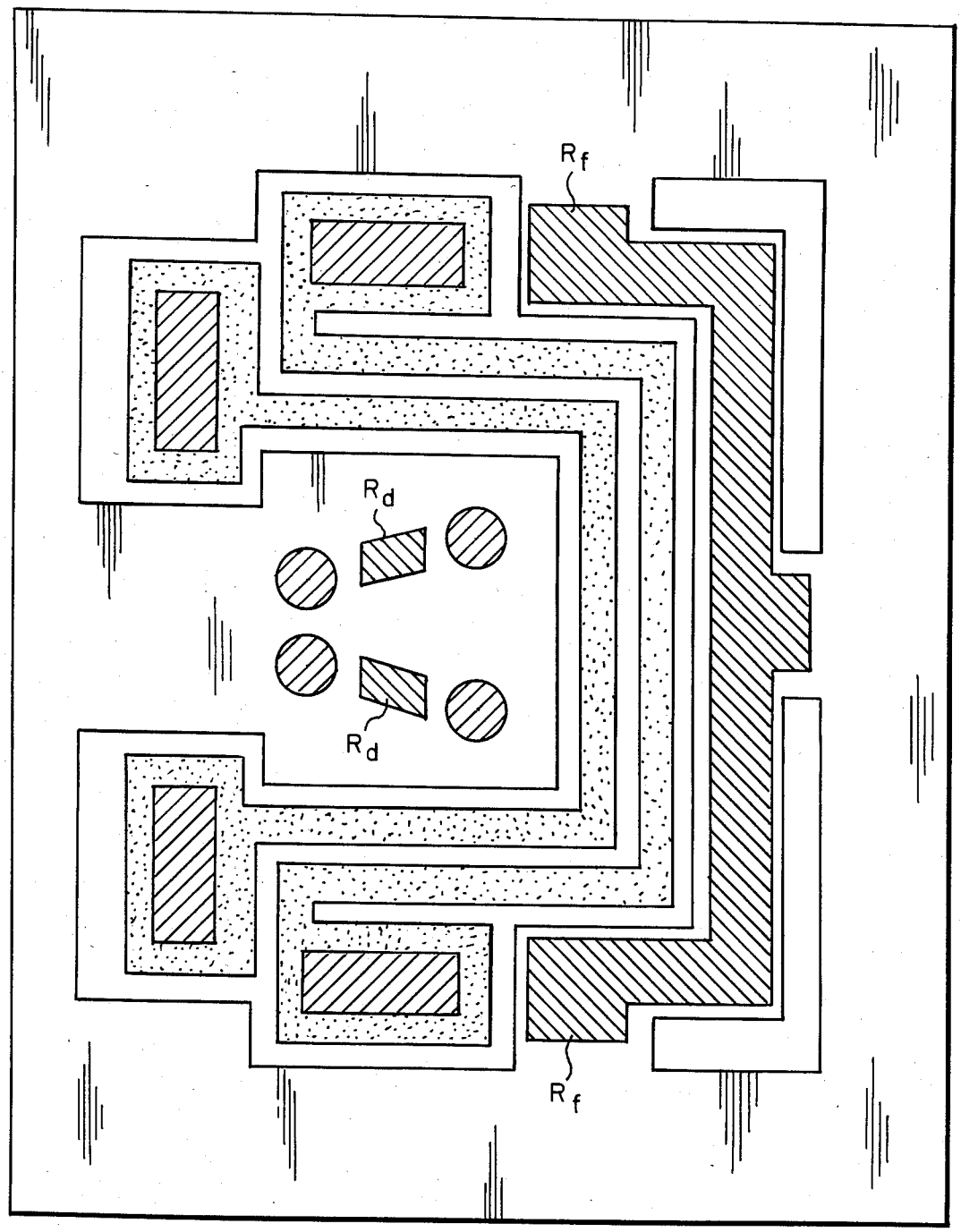
FIG. 5 is a detail in plan view showing the structure of FIG. 4 with deposited resistors applied to the anodized layer.

FIG. 5 shows a pattern for depositing resistive elements over the anodized niobium. Since the selective anodization process provides a layer of insulation over the ground plane at the same time that it serves to isolate the individual Josephson junctions, the resistors may be deposited directly over the anodized areas. It is also possible to route a resistor directly to a ground plane contact, not shown in this illustration. Shown in FIG. 5 are typical interferometer feed resistors $R_f$ and damping resistors $R_d$. The resistor material is typically molybdenum which may be approximately 800 angstroms units thick, although other metallic films are also suitable. Note that the resistors are deposited only over planar regions thus obviating any step coverage requirement, which could result in faulty resistor values.

Figure 6:
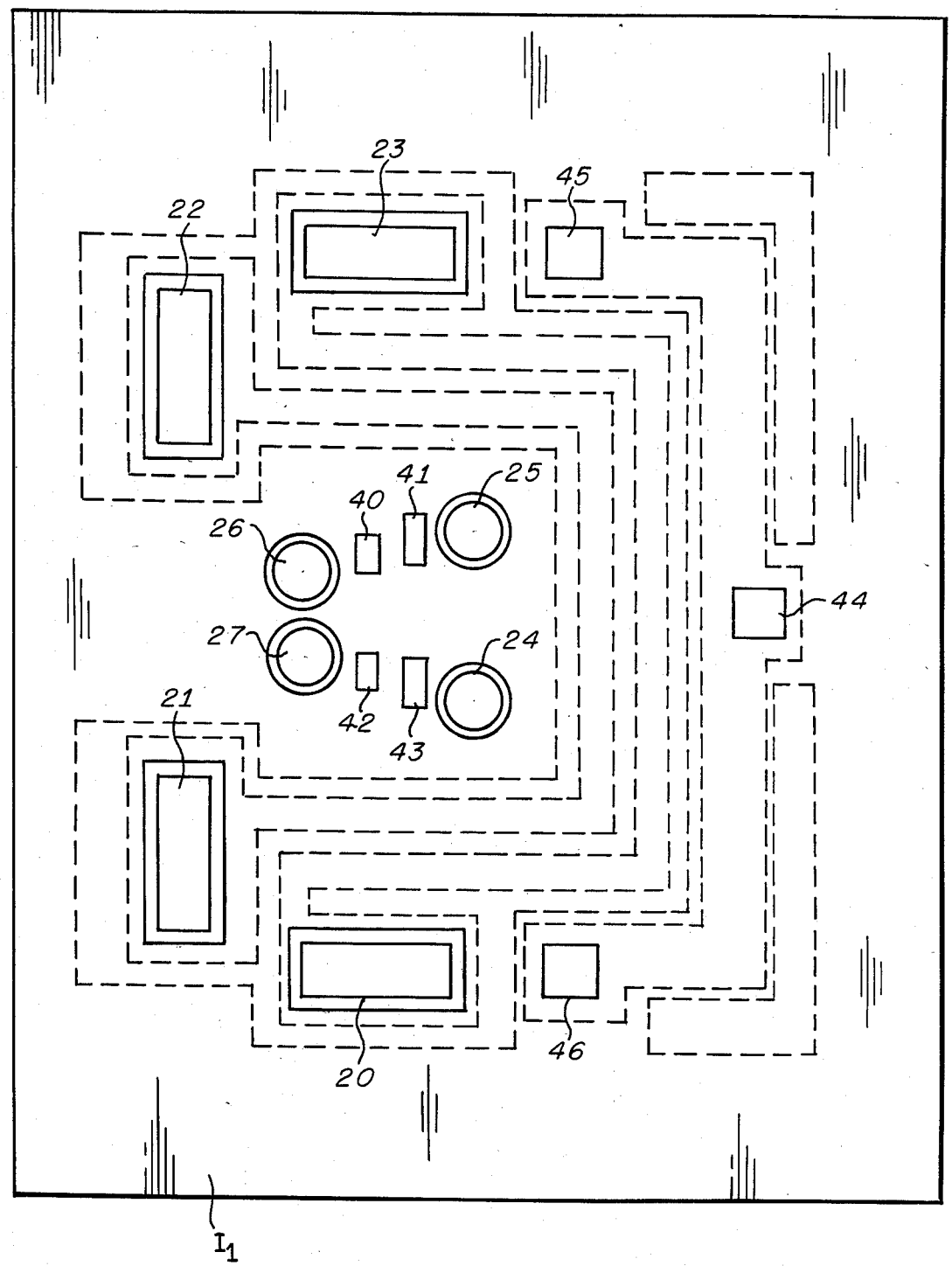
FIG. 6 is a detail in plan view showing an insulating layer applied over the structure of FIG. 5, with via locations for junctions and contacts.

FIG. 6 shows the pattern for laying down an insulating layer $I_1$ of $SiO_2$, approximately 2500 A thick, which is deposited over the resistors and the exposed anodized structure, patterned as shown by the unshaded areas to form vias to the Josephson junctions 24-27, contact junction areas 20-23, and connections 40-46 to the resistors $R_d$ and $R_f$. The $SiO_2$ layer $I_1$ serves to insulate the edges of the Trilayer and the resistors, and to provide additional ground plane insulation of desirably low dielectric constant. The $SiO_2$ layer $I_1$ may be patterned to form compensating capacitors for the control line busses, as shown in FIG. 7 at 66, 68.

Figure 7:
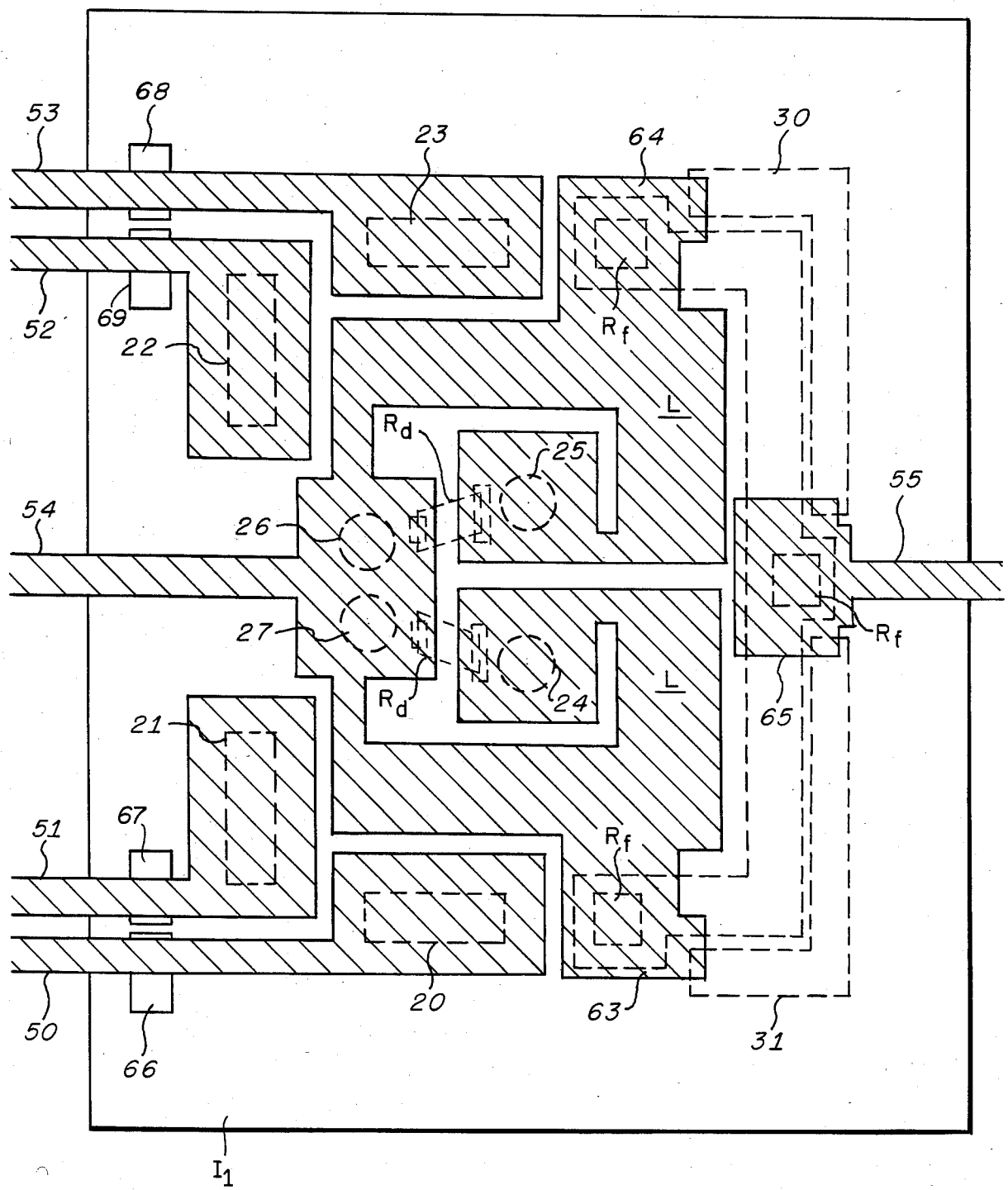
FIG. 7 is a further detail, showing the structure of FIG. 6 in plan view with a top-most superconductive layer applied for counter electrodes, inductive loops and busses.

In the next step of the process, the interferometer is completed by depositing the final contact layer $S_3$ of niobium and patterning it, as shown in FIG. 7. This layer forms the superconductive transmission lines 50-55, which contact the large area contact junctions 20-23, and inductive loops L, L which make contact to the non-anodized upper electrodes of the Josephson interferometer junctions at 24-27, and also contacts the damping and feed resistors, $R_d$ and $R_f$. Also shown are extended areas of superconductive material 63-65 which provide a double thickness of superconductor at each end of the flux trapping slots 30 and 31. By providing a double thickness of superconductive material, the region properties in the superconductive state are enhanced in these areas, consequently serving to channel the residual flux into the flux trapping slot. The $S_3$ layer is preferably composed of niobium approximately 3,000 angstrom units thick.

FIG. 8 shows an enlarged cross sectional view taken through the contact pad and resistor contact areas of FIG. 3 along line 8—8. The sequential deposition of layers $S_1$, B, $S_2$, A, R, I and $S_3$ are shown thereon. The general areas denoting the large contact junction 20, deposited resistor $R_f$, and flux trap 31, are also shown. FIG. 9 is a second sectional view through FIG. 3 along line 9—9, showing details of the inductive loop L and Josephson junction region 62 shown at 24 in FIG. 7.

Figure 10:
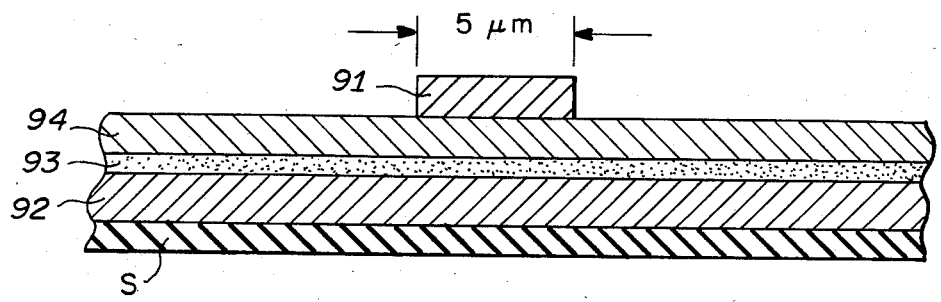
FIG. 10 is an elevation view showing a conventional parallel plate transmission line in cross-section.

The characteristic impedance, propagation delay, and inductance of the transmission lines are functions of the geometry of the structure. FIG. 10 shows a transmission line structure of the prior art, where the logic signals are carried over parallel plate transmission lines such as formed by a superconductive line 91, over a superconductive ground plane 92, separated by two layers of insulation, 93 and 94. The superconductive ground plane, 92, such as niobium of 3,000 Angstrom units thickness, is anodized to a depth of 350 Angstrom units as shown by layer 93. A second insulating layer of silicon oxide (SiO) 94 is deposited over the anodize, this layer being of the order of 1,500 Angstrom units in thickness. Finally, the superconductive electrode, 91, is deposited on the upper insulating layer, and may typically range from 2.5 to 5 um in width. Preferably, such a conductor is of the order of 2,000 Angstrom units thick.

Figure 11:
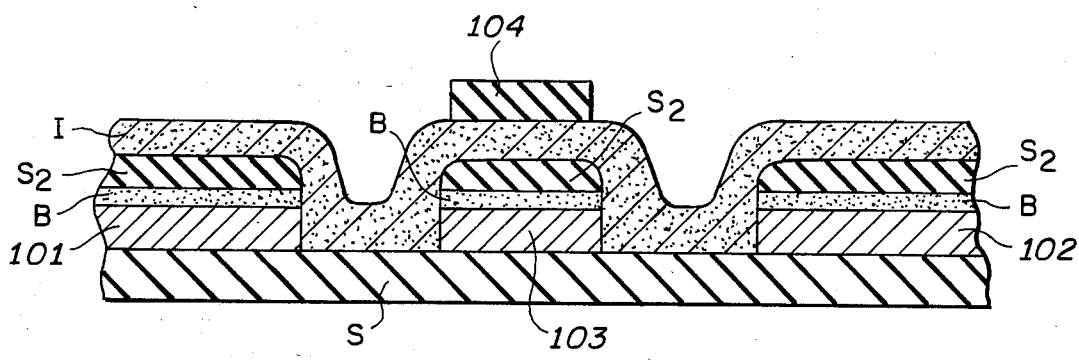
FIG. 11 is an elevation view showing a functionally coplanar transmission line of the present invention in cross-section.

In the construction of the present invention this form of transmission line is still used extensively, such as lines 50-55 in FIG. 7. However, the area of the control lines and loop inductances is not of this conventional structure, since a substantial area of the ground plane is removed in the area underlying the loop inductances. Therefore, the conventional analysis as a parallel plate transmission line is not useful. However, by treating the loop inductors as a coplanar wave guide, as shown in FIG. 11, where elements 101 and 102 represent the adjacent ground plane, element 103 represents a control line, element 104 represents a deposited loop inductor and elements 101, 102 and 104 are all substantially coplanar with respect to the material thickness, certain advantageous properties are observed. Thus, for typical line widths and film thicknesses used in Josephson device fabrication, a parallel plate transmission line has an inductance of 0.01–0.2 pH/um, while coplanar transmission line beneficially ranges about 0.2–0.6 pH/um. The factors determining the loop inductance are the dimensions of the width of the line and the edge gap to the adjacent ground plane. The smaller the ratio of line width to gap width the greater the inductance.

While it is desirable to increase the loop inductance in order to maximize the gain of the interferometer, a trade-off must be made, since, as the loop inductance is increased, the allowable gate current margin decreases. It has been determined that for junction critical currents of the order of 50 ua, the desired optimum inductance L is about 12 pH. In the prior art transmission lines effort must be expended to increase the inductance of the loops because of the lower inherent inductance. Thus resort is made to such structures as ground plane holes underlying the inductive element or insulator steps also underlying the inductor. For a coplanar transmission line this situation is reversed since a coplanar line has a higher inductance per unit length, and care is necessary to avoid exceeding the optimum inductance. Thus, in the structure of the present invention the loop needs to be maintained quite short. Further, it is desirable to maintain the ratio of line-width to gap-to-the-ground plane as large as possible which tends to decrease the inductance of the line. The coplanar structure model is a useful approximation as long as the width of the bus is substantially greater than its thickness, even though the layers are not actually aligned in the plane of the ground plane.

Further consideration must be given to the mutual inductance $L_m$ between the control lines and the inductive loops which contact the junctions. Again, it is desired to make the mutual inductance as close to the loop inductance as possible since this will maximize the gain of the interferometer. Thus, as shown in FIG. 4 and FIG. 7, it is necessary to design the loop L so that it runs over the control lines 28, 29 for the largest portion of its length, subject to the constraint that the control lines may not overlap the Josephson junctions themselves because this would require additional structural layers. Further, inductive loop L is narrowed at each end where it feeds into the junction in order to provide the largest degree of coupling, as may be seen from FIG. 7, where the narrowing of the loops adjacent to the junctions provides a concentration of current in the loop inductances overlying the control lines. In order to optimize the ratio of mutual inductance to self-inductance, since the mutual inductance is not readily increased, it may be necessary to increase the value of the self-inductance, so that the optimum value of 12 pH may be exceeded.

A second requirement is to minimize the magnitude of inductive discontinuities where the control lines 50-53 in FIG. 7 pass over the interferometer. Minimizing the loop dimensions helps reduce such disturbances. Excess inductance can be compensated for by adding capacitors at either end of a control line. For example, FIG. 7 shows capacitor sits 66-69 associated with the control lines. A via is formed by etching through the silicon dioxide insulator $I_1$ underneath the transmission lines 50-53. This brings the lines in contact with the anodized niobium layer A as a dielectric medium between the lines 50-53 and the ground plane layer $S_1$. The extremely thin layer of insulating material with favorable dielectric constant provides capacitance between the stripline and the ground plane.

A preferred method that may be utilized in fabricating a superconductive integrated circuit of the magnetically controlled interferometer type using the layers and steps of Table III and the SNAP process, comprises the following steps:

1. Depositing niobium ground plane $S_1$ by sputtering 1,000–5,000 A units thick on oxidized silicon substrate S.
2. Forming a barrier B by native oxidation of the ground plane $S_1$ or by depositing a layer of silicon, gernamium or an amorphous alloy thereof 30–400 A thick by rf diode sputter deposition in a gaseous atmosphere.
3. Depositing a layer of niobium 200–600 A thick by sputtering. This forms the upper superconductive layer $S_2$.
4. Using standard photoresistive procedures to pattern the upper superconductive layer $S_2$ for defining the locations of interferometer junctions and large area contact junctions.
5. Anodizing the upper superconductive layer $S_2$ in regions exposed by the photoresist mask to form anodized insulating layer A.
6. Using standard photoresistive procedures and chemical or plasma etching to pattern Trilayer $S_1$-B-$S_2$, as a whole forming groundplane, control lines, junctions and flux traps.
7. Depositing a layer of molybdenum 600–1000 A thick by sputtering, to form the resistor layer $R_1$.
8. Using standard photoresistive procedures and chemical or plasma etching through a photoresist mask to form the desired individual resistors.
9. Depositing an insulator $I_1$ of $SiO_2$ by sputtering and removing the unwanted $SiO_2$ after sputtering by standard photoresistive procedures to pattern and etch the insulator layer to expose the upper niobium layer $S_2$ and resistors R for effecting electrical connections at required points to circuit patterns which will subsequentially be deposited.
10. Depositing and patterning a niobium layer 3,000 A thick by sputtering to form the upper superconductive contact layer $S_3$, including transmission lines, inductive loops, interconnects and electrical contacts.

It will be appreciated that the above described method is exemplary, other methods being usable to fabricate superconductive integrated circuits utilizing Josephson magnetically controlled logic gates in accordance with the step-saving features of the invention. Further, other superconductive metals, such as lead alloys, may be utilized in place of niobium and other suitable insulating materials used where it is not desired to utilize the selective niobium anodization process.

It is also appreciated from the foregoing that in practicing the invention for fabricating Josephson junction magnetically controlled logic integrated circuit chips as few as four deposition and patterning steps are required. The resulting circuit is functionally substantially identical to the circuits of chips of the prior art, which prior art arrangements and processes required at least nine deposition steps and nine patterning steps.

It will also be appreciated that other gates may be constructed by utilizing alterations of the techniques disclosed herein including two-junction interferometers and combinations of the multi-junction interferometers with current injection logic gates. Josephson micro-circuits may be typically constructed utilizing one or both of two different superconductors such as niobium and lead alloys. The techniques of the present invention described herein are applicable to both materials, the basic concepts of the invention being applicable to more general circuits than the particular embodiments described.

It should be noted in the present invention that the first superconductive layer $S_1$ serves as the base electrode of the Josephson junctions, as the ground plane, for the control lines, and as flux traps. This is in contrast to embodiments of the prior art where a separate ground plane layer is provided or where the ground plane in coincident with the counterelectrode rather than the base electrode, and a separate superconductive layer is used for the control lines.

Refinements to the circuit may be effected with respect to performance or size by conventional techniques. Matching capacitors may be fabricated by utilizing appropriate cutouts in the insulating layer underneath the strip transmission lines and additional inductance may be obtained in superconducting loops by increasing loop length or utilizing groundplane cutouts. It will be appreciated that the circuit formed by the chip of FIG. 3 is precisely the required circuit of FIG. 1 and can be designed with desired parameter values. Although some of the various stray capacitances and inductances will be different with respect to a comparable circuit fabricated using separate layers for ground plane, base electrodes and control lines, these differences can be accommodated by utilizing the circuit refinements discussed above. Josephson circuits comprising lead alloys or all refractory materials may be fabricated utilizing the processes of the present invention.

It will be appreciated with respect to the above described embodiments that generally only representative elements are included to illustrate the concepts of the invention with respect to these elements. In practical circuits numerous such elements will be utilized. It will also be appreciated with respect to the above described embodiments of the invention that the layer thicknesses specified are exemplary, other thicknesses being useful in practicing the invention and that certain features of the drawings have been exaggerated for clarity.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A superconductive logic device comprising:
    (a) a first layer of superconductive material, including at least one inductive loop of superconductive material for magnetic control and a ground plane, said loop and said ground plane coplanar with said first layer,
    (b) a barrier layer overlaying said first layer,
    (c) a second layer of superconductive material, superposed on said barrier layer such that at least two superconductive junctions are formed by said first and second superconductive layers and said barrier layer, whereby tunneling currents can flow therethrough between said superconductive layers, and
    (d) a third layer of superconductive material including at least one inductive loop of superconductive material superposed with respect to said first and second superconductive layers with insulating means therebetween, conductively coupled to said two superconductive junctions, and responsive to inductive coupling from said inductive loop for magnetic control for biasing said superconductive junctions thereby interrupting at least a portion of said tunneling currents when a predetermined current is applied to said inductive loop for magnetic control.

2. The logic device of claim 1, further comprising a plurality of said superconductive junctions having base electrodes in said first layer with a common electrical connection, and including a plurality of counter electrodes in said second layer, ones of said counter electrodes respectively superposed over ones of said base electrodes.

3. The logic device of claim 1, including a large area contact junction having a lower electrode in said first layer of superconductive material, an upper electrode in said second layer of superconductive material, and a large area tunneling barrier therebetween, said area of said large contact junction being such that said large area contact junction has a critical current so as to remain at zero junction voltage at all current loadings of said junction, so that electrical contact of substantially zero resistance is effected from said second layer of superconductive material to said first layer of superconductive material by means of said large area contact junction.

4. The logic device of claim 1 in which said first and second layers of superconductive material are patterned to form at least one flux trapping site therein, said site comprised of a region wherein said superconductive material has been removed in proximity to said inductive loops for magnetic control and junction biasing.

5. The logic device of claim 4, further comprising a region of superconductive material superposed over said first and second layers of superconductive material and adjoining said flux trapping site, thereby constituting an area of multiple thickness of superconductive material substantially thicker than said first and second layers.

6. The logic device of claim 1, wherein said inductive loop for magnetic control further comprises first waveguide transmission line means coplanar with said ground plane, for magnetically biasing said at least two superconductive junctions.

7. The logic device of claim 3, said third layer of superconductive material further comprising second waveguide transmission line means substantially coplanar with said ground plane and conductively coupled to said upper electrodes of said large area contact junction, said second waveguide transmission line means being further magnetically coupled to said at least one inductive loop for magnetic control, for magnetically biasing said at least two superconductive junctions.

8. The logic device of claim 7 wherein said insulating means defines an opening therethrough superposed over said ground plane and said second transmission line means is superposed over said opening thereby defining a capacitor, with said insulating means constituting a dielectric for said capacitor.

9. The logic device of claim 1, wherein said second layer of superconductive material is anodized through to said barrier layer except at the location of said superconductive junctions.

10. The logic device of claim 9, wherein said barrier layer is further free from anodization at the locations of said large area contact junctions, said first and second layers of superconductive material with said barrier layer therebetween and with said second superconductive layer anodized therethrough comprising a Trilayer.

11. The logic device of claim 10, including a layer of resistive material deposited over said anodized second layer of superconductive material and beneath said insulating means, said layer of resistive material being patterned to form resistors for said logic device.

12. A superconductive logic device comprising:
 (a) a first layer of superconductive material, including at least one inductive loop of superconductive material for magnetic control and a ground plane, said loop and said ground plane coplanar with said first layer,
 (b) a layer of insulating material overlaying said first layer, having openings therethrough defining a plurality of superconductive junctions,
 (c) a barrier layer overlaying said openings
 (d) a second layer of superconductive material, superposed on said barrier layer, such that at least two superconductive junctins are formed by said first and second superconductive layers and said barrier layer, whereby tunneling currents can flow therethrough between said superconductive layers,
 said second layer of superconductive material defining at least one inductive loop superposed with respect to said first superconductive layer, and responsive to inductive coupling from said loop for magnetic control for biasing said at least two superconductive junctions, thereby interrupting said tunneling currents when a predetermined current is applied to said inductive loop for magnetic control.

13. The logic device of claim 12, said plurality of superconductive junctions having base electrodes in said first layer with a common electrical connection, and including a plurality of counter electrodes in said second layer respectively superimposed over said base electrodes.

14. The logic device of claim 12, including a large area contact junction having a lower electrode in said first layer of superconductive material, an upper electrode in said second layer of superconductive material, and a large area tunneling barrier therebetween, said area of said large area contact junction being such that said large area contact junction has a critical current so as to remain at zero junction voltage at all current loadings of said junction, so that electrical contact of substantially zero resistance is effected from said second layer of superconductive material to said first layer of superconductive material by means of said large area contact junction.

15. The logic device of claim 12, in which said first and second layers of superconductive material are patterned to form at least one flux trapping site therein, said site comprised of a region wherein said superconductive material has been removed in proximity to said inductive loops for magnetic control and junction biasing.

16. The logic device of claim 15, further comprising a region of superconductive material superposed over said first and second layers of superconductive material and adjoining said flux trapping site, thereby constituting an area of multiple thicknesses of superconductive material substantially thicker than said first and second layers.

17. The logic device of claim 12, wherein said inductive loop for magnetic control further comprises first waveguide transmission line means coplanar with said ground plane, for magnetically biasing said at least two superconductive junctions.

18. The logic device of claim 14, said second layer of superconductive material further comprising second waveguide transmission line means substantially coplanar with said ground plane and electrically coupled to said upper electrodes of said large area contact junction, said second waveguide transmission line means being further magnetically coupled to said at least one inductive loop for magnetic control, for magnetically biasing said at least two superconductive junctions.

19. The logic device of claim 18, wherein said layer of insulating material defines an opening therethrough superposed over said ground plane and said second transmission line means is superposed over said opening thereby defining a capacitor, with said insulating material constituting a dielectric for said capacitor.

20. The logic device of claim 12, including a layer of resistive material deposited over said insulating layer and beneath said barrier layer, said layer of resistive material being patterned to form resistors for said logic device.

* * * * *